(12) United States Patent
Hashimoto et al.

(10) Patent No.: US 7,186,456 B2
(45) Date of Patent: Mar. 6, 2007

(54) EASILY SLIDABLE POLYIMIDE FILM AND SUBSTRATE EMPLOYING IT

(75) Inventors: Masafumi Hashimoto, Ube (JP); Toshiyuki Nishino, Ube (JP); Toshihiko Anno, Ube (JP); Hiroaki Yamaguchi, Ichihara (JP)

(73) Assignee: Ube Industries, Ltd. (JP)

( * ) Notice: Subject to any disclaimer, the term of this patent is extended or adjusted under 35 U.S.C. 154(b) by 0 days.

(21) Appl. No.: 10/952,219

(22) Filed: Sep. 28, 2004

(65) Prior Publication Data

US 2005/0074592 A1 Apr. 7, 2005

(30) Foreign Application Priority Data

Oct. 2, 2003 (JP) ............................. 2003-344563

(51) Int. Cl.
*B32B 5/16* (2006.01)
*B32B 15/08* (2006.01)
*B32B 27/08* (2006.01)

(52) U.S. Cl. ...................... 428/323; 428/327; 428/332; 428/339; 428/457; 428/458; 428/473.5

(58) Field of Classification Search ..................... None
See application file for complete search history.

(56) References Cited

U.S. PATENT DOCUMENTS 5,972,474 A * 10/1999 Tsuzuki et al. ............. 428/141

FOREIGN PATENT DOCUMENTS

| JP | 06-100714 A | 4/1994 |
| JP | 06-192446 A | 7/1994 |
| JP | 2004-217907 A | 8/2004 |

* cited by examiner

*Primary Examiner*—Monique R. Jackson
(74) *Attorney, Agent, or Firm*—DLA Piper US LLP

(57) ABSTRACT

An easily slidable polyimide film having a polyimide surface layer comprising a polyimide which is thermoplastic and has a glass transition temperature of 190–450° C., wherein there are dispersed in the polyimide of the polyimide surface layer, in a proportion of approximately 0.5–10 mass % based on the polyimide of the polyimide surface layer, wholly aromatic polyimide particles made of a polyimide comprising at least 80 mass % of a pyromellitic acid component and a p-phenylenediamine component, and having a median size of 0.3–0.8 μm and a maximum size of no greater than 2 μm, in at least about 1 μm of the polyimide surface layer.

10 Claims, 2 Drawing Sheets

EASILY SLIDABLE POLYIMIDE FILM AND SUBSTRATE EMPLOYING IT

BACKGROUND OF THE INVENTION

1. Field of the Invention

The present invention relates to a slidable polyimide film, having fine protrusions on the film surface and a satisfactory film surface sliding property, which is easily wound up onto winding rolls in large lengths and exhibits a heat fusion bonding property, as well as to a copper-clad laminate employing it and, particularly, it relates to an easily slidable polyimide film suitable as a stock film for formation of fine patterns on flexible printed boards, TABs or the like, and to a copper-clad laminate employing it.

2. Description of the Related Art

Polyimide films have been used for laminates, flexible printed boards and the like because of their excellent heat resistance, chemical resistance, mechanical strength and electrical properties. However, polyimide films have been problematic in terms of adhesive properties. Methods for improving the adhesive properties include methods of surface treatment such as alkali treatment, corona treatment, sand blasting and cold plasma treatment. However, while such methods are effective at improving the adhesive properties, they require adhesive agents such as epoxy resin-based adhesive agents to be added in addition to the polyimides, and these lower the overall heat resistance of the flexible substrates.

As a result there have been proposed polyimide films having a thermoplastic polyimide layer, such as a thermoplastic single layer polyimide film or a multilayer polyimide film having a thermoplastic thin-layer prepared by laminating thermoplastic polyimide thin-layers on both sides of a heat-resistant polyimide layer. (These may hereinafter be referred to simply as "thermoplastic polyimide films.)

However, when such thermoplastic polyimide films have smooth surfaces, they experience high friction during production of the wound film on a winding roll, or during lamination with copper films, leading to problems such as creasing or sticking to rolls and, as this has constituted a restriction on winding, a need has existed for improvement in the surface sliding property of thermoplastic polyimide films.

Conventional methods for improving the surface sliding property of polyimide films include methods of surface treatment such as embossing, and methods of reducing surface friction by mixing inorganic powders such as calcium phosphate (Japanese Unexamined Patent Publication No. 62-68852) or silica (Japanese Unexamined Patent Publication No. 62-68853) with the polyimide film to produce fine protrusions on the film surface. There has also been proposed a method of producing a polyimide film by cast film formation of a polyamic acid solution obtained by dispersing a fine inorganic filler for polymerization in the solvent (Japanese Unexamined Patent Publication No. 6-145378).

However, the first type of surface treatment method has had a drawback in that the appearance of the film is easily impaired by excessive irregularities produced in the film surface. The second type of method involves mixing an inorganic powder in a polyamic acid solution, but unless a special dispersing apparatus is used, it is difficult to uniformly disperse the inorganic powder in the polyamic acid solution, and the resulting lack of uniform dispersion produces residual aggregates which often form excessively large protrusions on the film surface. In the third type of method as well, it is difficult to uniformly disperse the fine particulate inorganic powder, and using an inorganic powder with a large particle size leads to a similar problem as in the second type of method.

Consequently, when such inorganic filler addition methods are applied for copper-clad laminates used for COFs or TABs which require fine patterns, the raised sections of the thermoplastic polyimide film surface often creates a hindrance to fine pitch formation.

SUMMARY OF THE INVENTION

The problems to be solved by the invention are the poor sliding property of thermoplastic polyimide films, and the formation of large surface protrusions which can hinder fine pitch formation when protrusions are produced in the film surface by prior art techniques for the purpose of improving sliding property.

The present invention relates to a polyimide film with enhanced sliding property having a polyimide surface layer comprising a polyimide which is thermoplastic and has a glass transition temperature of 190–450° C., wherein there are dispersed in the polyimide of the polyimide surface layer, in a proportion of approximately 0.5–10 mass % based on the polyimide of the polyimide surface layer, wholly aromatic polyimide particles made of a polyimide comprising at least 80 mol % of a pyromellitic acid component and a p-phenylenediamine component, and having a median size of 0.3–0.8 µm and a maximum size of no greater than 2 µm, in at least about 1 µm of the polyimide surface layer.

The invention further relates to a polyimide film with enhanced sliding property having an inorganic powder-free polyimide surface layer comprising a polyimide which is thermoplastic and has a glass transition temperature of 190–450° C., having dispersed therein in a proportion of approximately 0.5–10 mass % based on the polyimide of the polyimide surface layer, wholly aromatic polyimide particles having a median size of 0.3–0.8 µm and a maximum size of no greater than 2 µm, in about 1 µm of the polyimide surface layer, and having a static friction coefficient (µs) of 0.05–0.7 and a dynamic friction coefficient (µk) of 0.05–0.7.

The invention still further relates to a polyimide film with enhanced sliding property having an inorganic powder-free heat fusion bonding polyimide surface layer having dispersed in at least one side thereof wholly aromatic polyimide particles in a proportion of approximately 0.5–10 mass % based on the polyimide of the heat fusion bonding polyimide surface layer, which film exhibits a heat fusion bonding property and a satisfactory winding property at long lengths.

The invention still further relates to a polyimide film with enhanced sliding property having an inorganic powder-free heat fusion bonding polyimide surface layer having wholly aromatic polyimide particles dispersed in the polyimide of the heat fusion bonding polyimide surface layer of at least one side, and having a static friction coefficient (µs) of 0.05–0.7 and a dynamic friction coefficient (µk) of 0.05–0.7, which film exhibits a heat fusion bonding property and a satisfactory winding property at long lengths.

The invention still further relates to a copper-clad laminate comprising a copper layer laminated onto the polyimide surface layer of the aforementioned heat fusion bonding polyimide film with enhanced sliding property.

The phrase "in at least about 1 µm of the polyimide surface layer" in the above description means in a rounded value of the thickness of 1 µm or greater, and preferably 0.7 µm or greater, of the polyimide surface layer.

The polyimide film with enhanced sliding property according to the invention may be laminated directly with a copper film without another resin layer and, having a suitable friction coefficient, it facilitates winding onto rolls.

The copper-clad laminate of the invention has no abnormally large protrusions on the polyimide surface, and can be subjected to microprocessing.

DETAILED DESCRIPTION OF THE INVENTION

Figure 1:
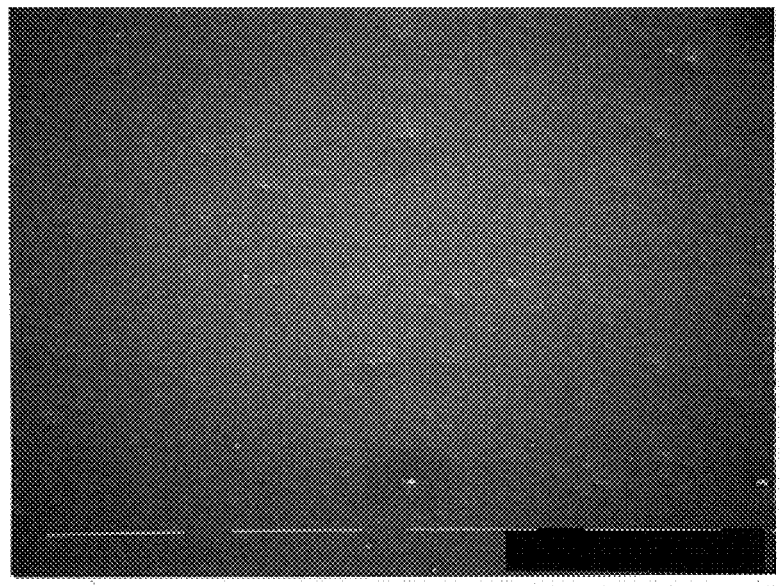
FIG. 1 is a photograph showing the result of SEM observation (2000×) of the surface of the polyimide film surface layer obtained in Example 4, as an example of the invention.

Preferred embodiments of the invention will be described below.

1) The aforementioned polyimide film with enhanced sliding property, wherein the polyimide surface layer comprises a thermoplastic polyimide obtained by copolymerizing 1,3-bis(4-aminophenoxy)benzene with 2,3,3',4'-biphenyltetracarboxylic dianhydride and 3,3',4,4'-biphenyltetracarboxylic dianhydride, with both components in a proportion (molar ratio) of 10/90 to 90/10.

2) The aforementioned polyimide film with enhanced sliding property, wherein the polyimide surface layer comprises a polyimide obtained by polymerizing 4,4'-diaminodiphenyl ether and 3,3',4,4'-biphenyltetracarboxylic dianhydride.

3) The aforementioned polyimide film with enhanced sliding property, wherein the thickness of the film as a whole is approximately 10–50 µm.

4) The aforementioned copper-clad laminate, wherein the copper layer is a laminated copper layer obtained by laminating a copper foil by a lamination method, or by forming a metal thin-film or copper plating layer by a thin-film forming method or an electroplating method.

The polyimide film with enhanced sliding property according to the invention may be one having a surface layer satisfying the aforementioned conditions on the surface of a film made of a thermoplastic polyimide with a glass transition temperature of 190–450° C. and preferably 190–320° C., or it may be one having a surface layer satisfying the aforementioned conditions on both sides of a heat-resistant polyimide layer.

The polyimide film with enhanced sliding property according to the invention may be produced, for example, by coating and drying a polyamic acid composition comprising a polyamic acid solution which gives a thermoplastic polyimide with a glass transition temperature of 190–450° C. and preferably 190–320° C., and wholly aromatic polyimide particles comprising at least 80 mol % of a pyromellitic acid component and a p-phenylenediamine component and having a median size of 0.3–0.8 µm and a maximum size of no greater than 2 µm, at 0.5–10 mass % and preferably 0.5–5 mass % based on the polyamic acid, onto a support to a dry thickness of approximately 1 µm or greater, and then heating the coating for removal of the solvent and imidization.

The polyimide film with enhanced sliding property according to the invention may also be produced, for example, by casting a polyamic acid solution which gives a polyimide core layer made of a heat-resistant polyimide onto a support and drying it to form a self-supporting film, and then coating and drying both sides thereof with a surface layer polyamic acid solution composition comprising a surface layer polyamic acid solution which gives a thermoplastic polyimide with a glass transition temperature of 190–450° C. and preferably 190–320° C., and wholly aromatic polyimide particles comprising at least 80 mol % of a pyromellitic acid component and a p-phenylenediamine component and having a median size of 0.3–0.8 µm and a maximum size of no greater than 2 µm, at 0.5–10 mass % and preferably 0.5–5 mass % based on the surface layer polyamic acid, to a dry thickness of approximately 1 µm or greater, and then if necessary, coating and drying the aforementioned surface layer polyamic acid solution composition to a dry thickness of approximately 1 µm or greater onto the other side and heating the coating for removal of the solvent and imidization.

As polyimides for the thermoplastic polyimide layer having a thermoplastic property and a glass transition temperature of 190–450° C. and preferably 190–320° C., there may be mentioned heat fusion bonding polyimides obtained by copolymerizing 1,3-bis(4-aminophenoxy)benzene with 2,3,3',4'-biphenyltetracarboxylic dianhydride and 3,3',4,4'-biphenyltetracarboxylic dianhydride, with both components in a proportion (molar ratio) of 10/90 to 90/10, preferably 20/80 to 80/20, or polyimides obtained by polymerizing 4,4'-diaminodiphenyl ether and 3,3',4,4'-biphenyltetracarboxylic dianhydride.

As polyimides for the aforementioned thermoplastic polyimide surface layer there may be mentioned polyimides having monomer components which produce a flexible structure in the polyimide molecule, such as 3,3',4,4'-benzophenonetetracarboxylic dianhydride, 2,2-bis(3,4-dicarboxyphenyl)propane, bis(3,4-dicarboxyphenyl)methane, bis(3,4-dicarboxyphenyl)ether, 4,4'-diaminodiphenylether and 3,3'-diaminodiphenylether.

As polyimides for the aforementioned heat-resistant polyimide layer there may be mentioned polyimides obtained by polymerization and imidization from 15–100 mol % or greater of 3,3',4,4'-biphenyltetracarboxylic dianhydride and 0–85 mol % of pyromellitic dianhydride or 15–100 mol % or greater of p-phenylenediamine and 0–85 mol % of 4,4'-diaminodiphenylether, or polyimides obtained by copolymerization of pyromellitic dianhydride with 4,4'-diaminodiphenylether and p-phenylenediamine, with both components in a proportion (molar ratio) of 10/90 to 90/10.

In the method described above, the polyamic acid solution which gives the heat-resistant polyimide may be obtained by polymerization according to a conventional method using an aromatic diamine and an aromatic tetracarboxylic dianhydride which yield a heat-resistant polyimide in an organic polar solvent.

As organic polar solvents there may be mentioned amide-based solvents such as N,N-dimethylformamide, N,N-dimethylacetamide, N-methyl-2-pyrrolidone or N-methylcaprolactam, or dimethylsulfoxide, hexamethylphosphoramide, dimethylsulfone, tetramethylenesulfone, dimethyltetramethylenesulfone, pyridine, ethylene glycol or the like.

In this method, the polyamic acid solution is preferably cast coated onto a support surface such as, for example, a polyester film, stainless steel mirror surface or belt surface, and brought to a semi-cured state or a preparatory dried state at 100–200° C. If the cast film is treated at a high temperature exceeding 200° C., drawbacks such as reduced adhesion may tend to result during the thermoplastic polyimide film production. A semi-cured state or preparatory dried state is a self-supporting state produced by heating and/or chemical imidization.

In this method, there is used a polyamic acid solution composition containing a surface layer polyamic acid solution which produces a thermoplastic polyimide having a glass transition temperature of 190–450° C. and preferably 190–320° C., and wholly aromatic polyimide particles comprising at least 80 mol % of a pyromellitic acid component and a p-phenylenediamine component and having a median size of 0.3–0.8 μm and a maximum size of no greater than 2 μm, in a proportion of 0.5–10 mass % and preferably 0.5–5 mass % with respect to the surface layer polyamic acid.

The wholly aromatic polyimide particles are preferably used in the form of a solvent mixture of wholly aromatic polyimide particles comprising a solution mixture containing wholly aromatic polyimide particles obtained by adding equimolar amounts of p-phenylenediamine and pyromellitic dianhydride to 80 mol % or greater in the aforementioned polar solvent for a 3–10 mass % proportion of polyimide in the mixture, with addition of a dispersant if necessary, and then increasing the temperature to about 160° C. while stirring in an inert gas atmosphere such as nitrogen gas, heating at that temperature for 2–5 hours and subsequently cooling, either alone or if necessary after removal or addition of the polar solvent.

In the invention, the wholly aromatic polyimide particles preferably employ an aromatic diamine and aromatic tetracarboxylic acid component consisting of 80 mol % or greater of p-phenylenediamine and pyromellitic dianhydride. If the aromatic diamine and aromatic tetracarboxylic acid component include other components than these, it will not be possible to obtain wholly aromatic polyimide particles with a size of 0.3–0.8 μm and a maximum size of no greater than 2 μm. If the polyimide particles have particle sizes outside of this range, it will be difficult to form fine protrusions on the thermoplastic polyimide layer surface, which is undesirable for a copper-clad laminate requiring a fine pattern.

The aforementioned median size is the size corresponding to the 50% cumulation value in the cumulative distribution curve.

The polyimide particles in the invention may be spherical, or they may be columnar with a short axis/long axis ratio of 2–10 and especially about 3–6. In the case of columnar shapes, the short axis is preferably 0.05–0.5 μm while the long axis is preferably 0.7–1.5 μm.

When no fine pattern is required as the copper-clad laminate, there may be used wholly aromatic polyimide particles with a median size of 0.3–10 μm.

In the invention, there is obtained a polyimide film with enhanced sliding property, having a polyimide surface layer made of a thermoplastic polyimide with a glass transition temperature of 190–450° C. and containing no inorganic particles, and having a static friction coefficient ($\mu s$) of 0.05–0.7 and preferably 0.1–0.7, and a dynamic friction coefficient ($\mu k$) of 0.05–0.7 and preferably 0.1–0.7, with no excessively large protrusions. The polyimide film may have a length of 20 m on greater.

In particular, it is possible to obtain according to the invention a slidable polyimide film having at least one side which is heat fusion bonding and can be wound up at length on a wind-up roll at a speed of 1 m/min or greater, as well as a copper-clad laminate employing it.

The copper-clad laminate of the invention may be obtained by laminating a copper layer onto the polyimide surface layer of the aforementioned polyimide film with enhanced sliding property.

The copper layer may be formed by laminating a copper foil by a lamination method, or by forming a metal thin-film or copper plating layer by a thin-film forming method or electroplating method.

Any known method may be employed for the copper foil lamination method or the copper layer forming method whereby a metal thin-film or copper plating layer is formed by a thin-film forming method or an electroplating method.

Throughout the present specification, the sliding property [static friction coefficient ($\mu s$) and dynamic friction coefficient ($\mu k$)] refers to that evaluated by the following procedure.

Following the procedure of ASTM D1894, one side of the polyimide film held at 23° C. and humidity-controlled to 60% RH for 24 hours was used as the substrate, with the opposite side attached to a metal sled in a slidable manner, and the friction coefficient was measured using a dynamic slip tester (slip speed: 150 mm/min).

The value on the chart when moving is taken as the static friction coefficient ($\mu s$), and the value on the chart when stationary is taken as the dynamic friction coefficient ($\mu k$).

The wind-up property was judged by winding up a long polyimide film onto a wind-up roll (core diameter: 15 cm) at a speed of 2 m/min, and judging the wind-up property as unsatisfactory if creases were produced and wind-up could not be accomplished smoothly onto the roll, or satisfactory if wind-up occurred smoothly without creases.

The glass transition temperature (Tg) was determined by means of DSC.

The size of the particulate polyimide was analyzed in the following manner.

N,N-Dimethylacetamide was used as the dispersing solvent for dispersion with ultrasonic waves for 60 minutes, and the size was measured as the particle diameter based on volume, by laser diffraction/scattering particle size measurement in a measuring range of 0.02–1000 μm. The slurry obtained by preparing the particulate polyimide was dispersed for 60 minutes using an ultrasonic cleaner. The dispersing medium was placed in a measuring cell and the dispersed slurry was dropped therein for dilution to a laser light lamp transmittance of 95–75%. Measurement was then performed by manual batch cell measurement.

Apparatus: Laser diffraction/scattering particle size distribution measuring instrument (Model: LA-910, product of Horiba Laboratories Co., Ltd.)

Measuring Mode: Manual Batch Cell Measurement

The form of the particulate polyimide was confirmed by SEM observation of the particulate polyimide on a glass slide.

The present invention will now be explained in greater detail through the following examples and comparative examples, with the understanding that the invention is in no way limited thereto.

Fine pattern formation was judged by migration ability when forming a 20 μm fine pattern: 10 μm line/10 μm space.

◯: Fine pattern formable x: Fine pattern not formable

REFERENCE EXAMPLE 1

Preparation of Particulate Polyimide

A particulate polyimide was prepared by dissolving p-phenylenediamine and pyromellitic dianhydride in N,N'- dimethylacetamide, adding a dispersant (0.5 mass % based on monomer), gradually heating to 160° C. while stirring (40 rpm) under a nitrogen atmosphere, and further stirring for 3 hours after reaching that temperature. The obtained particulate polyimide was analyzed by measuring the particle distribution with a laser diffraction/scattering particle size distribution measuring instrument, which indicated a median size of 0.3 μm and a distribution range of 0.1–1 μm. Upon confirming the particulate polyimide form by SEM observation, the particles were found to be columnar with a short/long axis ratio of 3–6.

EXAMPLE 1

The particulate polyimide was added to an 18 mass % polyamic acid solution composed mainly of 3,3',4,4'-biphenyltetracarboxylic dianhydride, 2,3,3',4'-biphenyltetracarboxylic dianhydride and 1,3-bis(4-aminophenoxy)benzene, at 0.5 mass % based on the monomer concentration, and the mixture was cast onto a stainless steel substrate to a dried film thickness of 25 μm, dried with hot air at 120° C., and peeled from the substrate to obtain a self-supporting film. The self-supporting film was slowly heated from 140° C. to 330° C. in a heating furnace to remove the solvent and accomplish imidization, and the long polyimide film was wound up onto a wind-up roll. The winding property during wind-up was satisfactory. The friction coefficient of the obtained film was also measured. The Tg of the polyimide composed mainly of 3,3',4,4'-biphenyltetracarboxylic dianhydride, 2,3,3',4'-biphenyltetracarboxylic dianhydride and 1,3-bis (4-aminophenoxy)benzene was 240° C.

The results of evaluating the obtained polyimide film were as follows.
Film thickness (μm): 25
Surface layer lubricating agent concentration (%): 0.5
Lubricating agent: Wholly aromatic particulate polyimide
Static friction coefficient (μs): 0.51
Dynamic friction coefficient (μk): 0.47

EXAMPLE 2

An 18 mass % polyamic acid solution composed mainly of 3,3',4,4'-biphenyltetracarboxylic dianhydride, 2,3,3',4'-biphenyltetracarboxylic dianhydride and 1,3-bis (4-aminophenoxy)benzene was cast onto a stainless steel substrate to a dried film thickness of 24 μm, and dried with hot air at 120° C. Onto the obtained film there was laminated a 5 mass % polyamic acid solution composed mainly of 3,3',4,4'-biphenyltetracarboxylic dianhydride, 2,3,3',4'-biphenyltetracarboxylic dianhydride and 1,3-bis(4-aminophenoxy)benzene, containing particulate polyimide at 2 mass % based on the monomer concentration, to a dried total film thickness of 25 μm, and this was dried with hot air at 120° C. and peeled from the substrate to obtain a self-supporting film.

The self-supporting film was slowly heated from 140° C. to 330° C. in a heating furnace to remove the solvent and accomplish imidization, and the long polyimide film was wound up onto a wind-up roll. The winding property during wind-up was satisfactory. The friction coefficient of the obtained film was also measured. The Tg of the polyimide composed mainly of 3,3',4,4'-biphenyltetracarboxylic dianhydride, 2,3,3',4'-biphenyltetracarboxylic dianhydride and 1,3-bis(4-aminophenoxy)benzene used for the surface layer was 240° C.

The results of evaluating the obtained polyimide film were as follows.
Film thickness (μm): 25
Surface layer lubricating agent concentration (%): 2.0
Lubricating agent: Wholly aromatic particulate polyimide
Static friction coefficient (μs): 0.37
Dynamic friction coefficient (μk): 0.33

EXAMPLE 3

A 10 mass % polyamic acid solution composed mainly of 3,3',4,4'-biphenyltetracarboxylic dianhydride, 2,3,3',4'-biphenyltetracarboxylic dianhydride and 1,3-bis(4-aminophenoxy)benzene was cast onto a stainless steel substrate to a dried film thickness of 3 μm, and dried with hot air at 120° C. Onto the obtained dried film there was laminated an 18 mass % polyamic acid solution composed mainly of 3,3',4,4'-biphenyltetracarboxylic dianhydride and p-phenylenediamine, to a dried total film thickness of 22 μm, and this was dried with hot air at 120° C., after which a solution obtained by adding particulate polyimide to a 10 mass % polyamic acid solution composed mainly of 3,3',4,4'-biphenyltetracarboxylic dianhydride, 2,3,3',4'-biphenyltetracarboxylic dianhydride and 1,3-bis(4-aminophenoxy)benzene, at 2 mass % based on the monomer concentration, was laminated thereover to a dried total film thickness of 25 μm, dried with hot air at 120° C. and peeled from the substrate to obtain a self-supporting film. The self-supporting film was heated in the same manner, and the long polyimide film was wound up onto a wind-up roll. The winding property during wind-up was satisfactory. The friction coefficient of the obtained film was also measured. The Tg of the polyimide composed mainly of 3,3',4,4'-biphenyltetracarboxylic dianhydride, 2,3, 3',4'-biphenyltetracarboxylic dianhydride and 1,3-bis (4-aminophenoxy)benzene used for the surface layer was 240° C.

The results of evaluating the obtained polyimide film were as follows.
Film thickness (μm): 25
Surface layer lubricating agent concentration (%): 2.0
Lubricating agent: Wholly aromatic particulate polyimide
Static friction coefficient (μs): 0.45
Dynamic friction coefficient (μk): 0.40

EXAMPLE 4

A 10 mass % polyamic acid solution composed mainly of 3,3',4,4'-biphenyltetracarboxylic dianhydride, 2,3,3',4'-biphenyltetracarboxylic dianhydride and 1,3-bis(4-aminophenoxy)benzene was cast onto a stainless steel substrate to a dried film thickness of 3 μm, and dried with hot air at 120° C. Onto the obtained dried film there was laminated an 18 mass % polyamic acid solution composed mainly of 3,3',4, 4'-biphenyltetracarboxylic dianhydride and p-phenylenediamine, to a dried total film thickness of 21 μm, and this was dried with hot air at 120° C., after which a 10 mass % polyamic acid solution composed mainly of 3,3',4,4'-biphenyltetracarboxylic dianhydride, 2,3,3',4'-biphenyltetracarboxylic dianhydride and 1,3-bis(4-aminophenoxy)benzene was laminated thereover to a dried thickness of 25 μm and dried with hot air at 120° C. Next, a solution obtained by adding particulate polyimide to a 5 mass % polyamic acid solution composed mainly of 3,3',4,4'-biphenyltetracarboxylic dianhydride, 2,3,3',4'-biphenyltetracarboxylic dianhydride and 1,3-bis(4-aminophenoxy)benzene, at 2 mass % based on the monomer concentration, was laminated thereover to a dried total film thickness of 25 μm, dried with hot air at 120° C. and peeled from the substrate to obtain a self-supporting film. The self-supporting film was heated in the same manner, and the long polyimide film was wound up onto a wind-up roll. The winding property during wind-up was satisfactory. The friction coefficient of the obtained film was also measured. The Tg of the polyimide composed mainly of 3,3',4,4'-biphenyltetracarboxylic dianhydride, 2,3,3',4'-biphenyltetracarboxylic dianhydride and 1,3-bis(4-aminophenoxy)benzene used for the surface layer was 240° C.

The results of evaluating the obtained polyimide film were as follows.
Film thickness (μm): 25
Surface layer lubricating agent concentration (%): 2.0
Lubricating agent: Wholly aromatic particulate polyimide
Static friction coefficient (μs): 0.33
Dynamic friction coefficient (μk): 0.31

The result of SEM observation of the surface of the surface layer of the polyimide film is shown in FIG. 1.

EXAMPLE 5

An 18 mass % polyamic acid solution composed mainly of 3,3',4,4'-biphenyltetracarboxylic dianhydride and 3,3'-diaminodiphenylether was cast onto a stainless steel substrate to a dried film thickness of 24 μm, and dried with hot air at 120° C. Onto the obtained dried film there was laminated a solution obtained by adding particulate polyimide to a 2 mass % polyamic acid solution composed mainly of 3,3',4,4'-biphenyltetracarboxylic dianhydride and 3,3'-diaminodiphenylether, at 2 mass % based on the monomer concentration, to a dried total film thickness of 25 μm, and this was dried with hot air at 120° C. and peeled from the substrate to obtain a self-supporting film. The self-supporting film was heated in the same manner, and the long polyimide film was wound up onto a wind-up roll. The winding property during wind-up was satisfactory. The friction coefficient of the obtained film was also measured. The Tg of the polyimide composed mainly of 3,3',4,4'-biphenyltetracarboxylic dianhydride and 3,3'-diaminodiphenylether used for the surface layer was 280° C.

The results of evaluating the obtained polyimide film were as follows.
Film thickness (μm): 25
Surface layer lubricating agent concentration (%): 2.0
Lubricating agent: Wholly aromatic particulate polyimide
Static friction coefficient (μs): 0.42
Dynamic friction coefficient (μk): 0.31

The polyimide films obtained in Examples 1 to 4 were used for lamination with continuous supply of a 12 μm-thick copper foil (rolled copper foil or electrolytic copper foil) on one side and a protective material (YUPIREX 25S) on the other side in a double belt press, and after preheating, thermocompression bonding/cooling was carried out continuously under pressure for lamination with a heating zone temperature (maximum heating temperature) of 330° C. (set), a cooling zone temperature (minimum cooling temperature) of 117° C., a contact bonding pressure of 40 kg/cm$^2$ and a contact bonding time of 2 minutes, to obtain a protective material-covered, single sided copper-clad laminate in a continuous roll-wound form.

The single sided copper-clad laminates were evaluated.
Copper foil and polyimide film peel strength (90° peel): ≧1 kgf/cm for all films.
Fine pattern formability: ○

The polyimide film obtained in Example 5 was used for vapor deposition of a Ni/Cr base metal and then copper by an ordinary method, and then electrolytic copper plating, to obtain a single sided copper-clad laminated base sheet in a continuous roll-wound form.

The single side copper-clad laminated base sheet was evaluated.
Copper foil and polyimide film peel strength (90° peel): 0.8 kgf/cm.
Fine pattern formability: ○

EXAMPLE 6

For preparation of a particulate polyimide, p-phenylenediamine and 3,3',4,4'-biphenyltetracarboxylic dianhydride were used instead of p-phenylenediamine and pyromellitic anhydride, to obtain polyimide powder.

The form of the polyimide powder was as follows.
Median size: 8.9 μm, distribution range: 0.1–22.8 μm.
Upon observation of the particulate polyimide form by SEM, it was found to be spherical.

The same procedure as Example 4 was followed, except for using this polyimide powder. The winding property during wind-up of the long polyimide film on a wind-up roll was satisfactory.

The results were as follows.
Film thickness (μm): 25
Surface layer lubricating agent concentration (%): 2.0
Lubricating agent: Wholly aromatic particulate polyimide
Static friction coefficient (μs): 0.35
Dynamic friction coefficient (μk): 0.29

Figure 2:
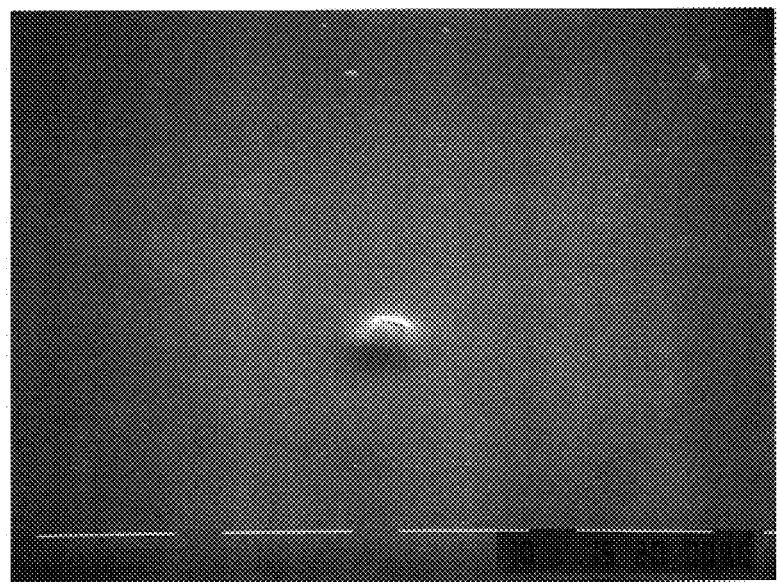
FIG. 2 is a photograph showing the result of SEM observation (2000×) of the surface of the polyimide film surface layer obtained in Example 6.

The result of SEM observation of the surface of the surface layer of the polyimide film is shown in FIG. 2.

The polyimide film obtained in Example 6 was used to obtain a protective material-covered single sided copper-clad laminate in a continuous roll-wound form.

The single side copper-clad laminates were evaluated.
Copper foil and polyimide film peel strength (90° peel): ≧1 kgf/cm.
Fine pattern formability: x

EXAMPLE 7

For preparation of a particulate polyimide, 3,3'-diaminodiphenylether and 3,3',4,4'-biphenyltetracarboxylic dianhydride were used instead of p-phenylenediamine and pyromellitic anhydride, to obtain polyimide powder.

The form of the polyimide powder was as follows.
Median size: 7.7 μm, distribution range: 0.2–22.8 μm.
Upon observation of the particulate polyimide form by SEM, it was found to be spherical.

The same procedure as Example 4 was followed, except for using this polyimide powder. The winding property during wind-up of the long polyimide film on a wind-up roll was satisfactory.

The results were as follows.
Film thickness (μm): 25
Surface layer lubricating agent concentration (%): 2.0
Lubricating agent: Wholly aromatic particulate polyimide
Static friction coefficient (μs): 0.38
Dynamic friction coefficient (μk): 0.32

Figure 3:
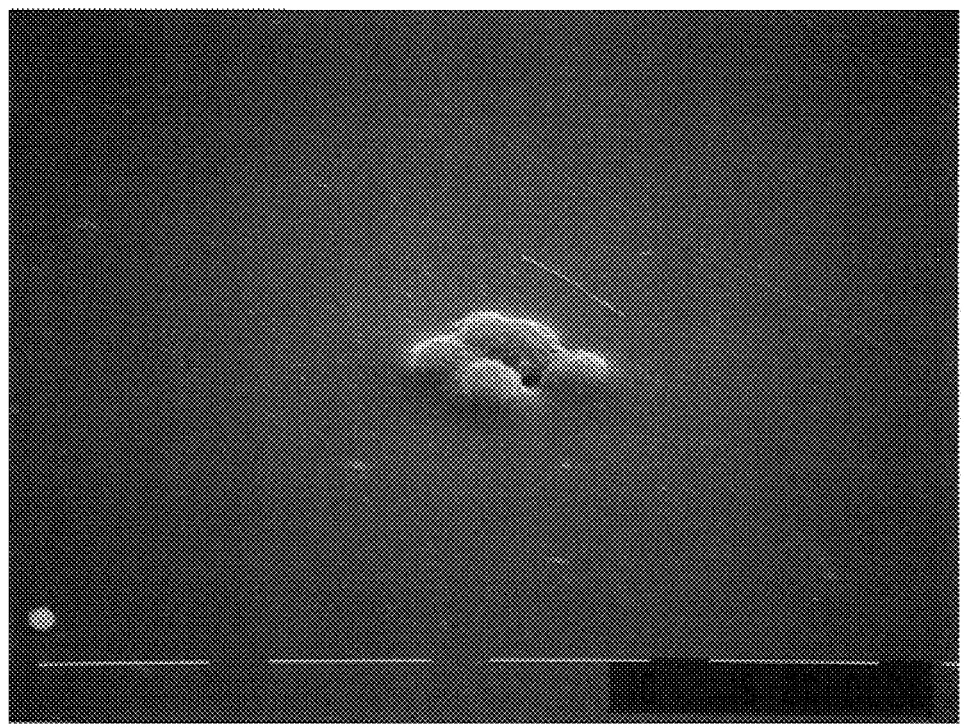
FIG. 3 is a photograph showing the result of SEM observation (2000×) of the surface of the polyimide film surface layer obtained in Example 7.

The result of SEM observation of the surface of the surface layer of the polyimide film is shown in FIG. 3.

The polyimide film obtained in Example 7 was used to obtain a protective material-covered single sided copper-clad laminate in a continuous roll-wound form.

The single side copper-clad laminates were evaluated.
Copper foil and polyimide film peel strength (90° peel): ≧1 kgf/cm.

Fine pattern: not-formable

The films with a large length obtained in Examples 1 to 7 all had a length of 20 m or greater.

COMPARATIVE EXAMPLE 1

The same procedure as Example 1 was carried out, except that the inorganic filler Silica Filler (median size: 0.13 μm) was used instead of particulate polyimide. The winding property during wind-up of the long polyimide film on a wind-up roll was unsatisfactory.

The results were as follows.
Film thickness (μm): 25
Surface layer lubricating agent concentration (%): 0.5

COMPARATIVE EXAMPLE 2

The same procedure as Example 2 was carried out, except that the inorganic filler Silica Filler (ST-ZL, median size: 0.13 μm) was used instead of particulate polyimide. The winding property during wind-up of the long polyimide film on a wind-up roll was unsatisfactory.

The results were as follows.
Film thickness (μm): 25
Surface layer lubricating agent concentration (%): 2.0

What we claim is:

1. An easily slidable polyimide film having a polyimide surface layer comprising a polyimide which is thermoplastic and has a glass transition temperature of 190–450° C., wherein there are dispersed in the polyimide of the polyimide surface layer, in a proportion of approximately 0.5–10 mass % based on the polyimide of the polyimide surface layer, wholly aromatic polyimide particles made of a polyimide comprising at least 80 mass % of a pyromellitic acid component and a p-phenylenediamine component, and having a columnar shape with a short axis/long axis ratio of 2–10, a median size of 0.3–0.8 μm and a maximum size of no greater than 2 μm, in about 1 μm of the polyimide surface layer.

2. An easily slidable polyimide film having an inorganic powder-free polyimide surface layer comprising a polyimide which is thermoplastic and has a glass transition temperature of 190–450° C., having dispersed therein, in a proportion of approximately 0.5–10 mass % based on the polyimide of the polyimide surface layer, wholly aromatic polyimide particles having a median size of 0.3–0.8 μm and a maximum size of no greater than 2 μm, in about 1 μm of the polyimide surface layer, and having a statistic friction coefficient (μs) of 0.05–0.7 and a dynamic friction coefficient (μk) of 0.05–0.7.

3. An easily slidable polyimide film according to claim 1 or 2, wherein the polyimide surface layer comprises a thermoplastic polyimide obtained by copolymerizing 1,3-bis(4-aminophenoxy)benzene with 2,3,3',4'-biphenyltetracarboxylic dianhydride and 3,3',4,4'-biphenyltetracarboxylic dianhydride, with both components in a molar ratio proportion of 10/90 to 90/10.

4. An easily slidable polyimide film according to claim 1 or 2, wherein the polyimide surface layer comprises a polyimide obtained by polymerizing 4,4'-diaminodiphenyl ether and 3,3',4,4'-biphenyltetracarboxylic dianhydride.

5. An easily slidable polyimide film according to claim 1 or 2, wherein the thickness of the film as a whole is approximately 10–50 μm.

6. A copper-clad laminate comprising a copper layer laminated onto the polyimide surface layer of an easily slidable polyimide film according to any one of claims.

7. A copper-clad laminate according to claim 6, wherein the copper layer is a laminated copper layer obtained by laminating a copper foil by a lamination method, by forming a metal thin-film or copper plating layer by a thin-film forming method or an electroplating method.

8. The polyimide film according to claim 1, further comprising an opposed surface layer comprising a polyimide which is thermoplastic and has a glass transition temperature of 190–450° C., wherein there are dispersed in the polyimide of the opposed surface layer, in a proportion of approximately 0.5–10 mass % based on the polyimide of the opposed surface layer, wholly aromatic polyimide particles made of a polyimide comprising at least 80 mass % of a pyromellitic acid component and a p-phenylenediamine component, and having a columnar shape with a short axis/long axis ratio of 2–10, a median size of 0.3–0.8 μm and a maximum size of no greater than 2 μm, in about 1 μm of the opposed surface layer.

9. The polyimide film according to claim 2, further comprising an opposed surface layer comprising a polyimide which is thermoplastic and has a glass transition temperature of 190–450° C., wherein there are dispersed in the polyimide of the opposed surface layer, in a proportion of approximately 0.5–10 mass % based on the polyimide of the opposed surface layer, wholly aromatic polyimide particles made of a polyimide comprising at least 80 mass % of a pyromellitic acid component and a p-phenylenediamine component, and having a columnar shape with a short axis/long axis ratio of 2–10, a median size of 0.3–0.8 μm and a maximum size of no greater than 2 μm, in about 1 μm of the opposed surface layer.

10. The polyimide film according to claim 6, further comprising an opposed surface layer comprising a polyimide which is thermoplastic and has a glass transition temperature of 190–450° C., wherein there are dispersed in the polyimide of the opposed surface layer, in a proportion of approximately 0.5–10 mass % based on the polyimide of the opposed surface layer, wholly aromatic polyimide particles made of a polyimide comprising at least 80 mass % of a pyromellitic acid component and a p-phenylenediamine component, and having a columnar shape with a short axis/long axis ratio of 2–10, a median size of 0.3–0.8 μm and a maximum size of no greater than 2 μm, in about 1 μm of the opposed surface layer.

* * * * *

UNITED STATES PATENT AND TRADEMARK OFFICE
CERTIFICATE OF CORRECTION

PATENT NO. : 7,186,456 B2 Page 1 of 1
APPLICATION NO. : 10/952219
DATED : March 6, 2007
INVENTOR(S) : Hashimoto et al.

It is certified that error appears in the above-identified patent and that said Letters Patent is hereby corrected as shown below:

Column 12, Line 10:

In claim 6, please add --1 or 2--after "claims".

Signed and Sealed this

Twenty-seventh Day of November, 2007

JON W. DUDAS
*Director of the United States Patent and Trademark Office*